United States Patent
Seo et al.

(10) Patent No.: US 6,936,558 B2
(45) Date of Patent: Aug. 30, 2005

(54) LOW TEMPERATURE SINTERABLE DIELECTRIC CERAMIC COMPOSITION, MULTILAYER CERAMIC CHIP CAPACITOR AND CERAMIC ELECTRONIC DEVICE

(75) Inventors: Dong Hwan Seo, Suwon (KR); Jong Hee Kim, Seoul (KR); Sung Hyung Kang, Suwon (KR); Soon Mok Choi, Seoul (KR); Hyuk Joon Youn, Suwon (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 135 days.

(21) Appl. No.: 10/601,776

(22) Filed: Jun. 24, 2003

(65) Prior Publication Data

US 2004/0121897 A1 Jun. 24, 2004

(30) Foreign Application Priority Data

Dec. 24, 2002 (KR) .................................. 10-2002-0083554

(51) Int. Cl.$^7$ ............................................ C04B 35/486
(52) U.S. Cl. ...................................... 501/135; 361/321.4
(58) Field of Search ......................... 501/135; 361/321.4

(56) References Cited

U.S. PATENT DOCUMENTS

| | | | |
|---|---|---|---|
| 4,816,429 A | * | 3/1989 | Nishioka et al. ............ 501/135 |
| 4,988,651 A | | 1/1991 | Nishioka et al. |
| 5,756,408 A | | 5/1998 | Terashi et al. |

FOREIGN PATENT DOCUMENTS

| | | |
|---|---|---|
| JP | 2000-143332 | 5/2000 |
| JP | 2000-327428 | 11/2000 |

OTHER PUBLICATIONS

Abstract—Japanese Patent No. JP5190020, Published Jul. 30, 2003.
Abstract—Japanese Patent No. JP1102806, Published Apr. 20, 1989.

* cited by examiner

*Primary Examiner*—Karl Group
(74) *Attorney, Agent, or Firm*—Lowe Hauptman & Berner, LLP

(57) ABSTRACT

A low temperature sinterable dielectric ceramic composition, as well as a multilayer ceramic chip capacitor and a ceramic electronic device. The dielectric ceramic composition comprises a major composition represented by the general formula: $x\{\alpha BaO, (1-\alpha)SrO\}$-$y\{SiO_2\}$-$z\{(1-\beta)ZrO_2, \beta Al_2O_3\}$ (wherein x, y and z are weight percentages; x+y+z=100, $55 \leq x \leq 75$, $10 \leq y \leq 35$, and $5 \leq z \leq 30$, $\alpha$ and $\beta$ are moles; $0.4 \leq \alpha \leq 0.8$, and $0.01 \leq \beta \leq 0.07$) and 2 to 10 parts by weight of a Zn—B-silicate glass composition, per 100 parts by weight of the major composition. The multilayer ceramic chip capacitor and a multilayer ceramic circuit board for the electronic device comprise a plurality of dielectric ceramic layers, internal electrodes arrayed inside the dielectric ceramic layers, and outer electrodes electrically connected to the internal electrodes, characterized in that the dielectric ceramic layer is a sintered body of the dielectric ceramic composition mentioned above, and the internal electrode is made of a conductive base metal material.

17 Claims, 3 Drawing Sheets

LOW TEMPERATURE SINTERABLE DIELECTRIC CERAMIC COMPOSITION, MULTILAYER CERAMIC CHIP CAPACITOR AND CERAMIC ELECTRONIC DEVICE

BACKGROUND OF THE INVENTION

1. Field of the Invention

The present invention relates to a dielectric ceramic composition for temperature compensation which can be sintered in conjunction with an internal electrode made of a base metal at a low temperature under a reducing atmosphere, and which has a low dielectric constant and a high dielectric quality factor (Q), as well as to a multilayer ceramic chip capacitor and a ceramic electronic device each using the ceramic composition.

2. Description of the Related Art

In recent years, with the advent of the information age, there is an increasing requirement for electronic devices which increase processing speed and improve radio frequency characteristics. Multilayer ceramic chip capacitors used in, for example, high frequency circuit filters also require a low dielectric constant and a high dielectric quality factor. They are widely used as electronic devices that can provide a stable reference capacitance.

Recently, there are (Ca,Sr)(Zr,Ti)$O_3$-based, MgO—$TiO_2$-based, BaO—$TiO_2$-based, and BaO—$TiO_2$-REO-based dielectric ceramic compositions that can be used for multilayer ceramic chip capacitors. These dielectric ceramic compositions can be sintered at a high temperature of 1,200° C. or more. In this regard, in order to sinter dielectric layers made of such dielectric compositions in conjunction with internal electrodes, high melting point metals such as Palladium (Pd) and Platinum (Pt) must be used as the internal electrodes. However, Pd and Pt are more expensive and higher in resistivity, compared with base metals such as Ag and Cu. Due to higher resistivity, equivalent series resistance (ESR) and inductance (ESL) are increased at high frequency, resulting in a high dielectric loss and a low dielectric quality factor.

Therefore, in order to use base metals such as Cu as internal electrodes, the use of a dielectric ceramic composition which can be sintered at a low temperature is required. Internal electrodes made of base metals may be oxidized upon being sintered in air. Therefore, co-sintering of dielectric layers and internal electrodes must be effected in a reducing atmosphere.

Exemplary low temperature sinterable dielectric ceramic compositions are disclosed in Japanese Patent Application Laid-Open Publication No. 5-190020; U.S. Pat. Nos. 5,756,408 and 4,988,651; and Japanese Patent Application Laid-Open Publication No. 1-102806.

Japanese Patent Application Laid-Open Publication No. 5-190020 discloses a dielectric ceramic composition that comprises a major composition represented by the general formula: a (xBa-yCa-zSr)O-b$SiO_2$-c$ZrO_2$—(d/2) $Al_2O_3$-e$TiO_2$ (wherein 5 mol %$\leq$a$\leq$6 mol %, 10 mol %$\leq$b$\leq$70 mol %, 0 mol %$\leq$c$\leq$30 mol %, 0 mol %<d$\leq$30 mol %, 0 mol %<e$\leq$30 mol %, a+b+c+d+e=100 mol %; and x+y+z=1). The dielectric ceramic composition does not have non-reducibility and thus base metals such as Cu cannot be used as internal electrodes. Furthermore, due to the use of glass process of heating a raw material mixture to a high temperature of 1,600° C. or more, followed by quenching quickly, it is difficult not only to disperse glass powders, but also to control particle size thereof.

U.S. Pat. No. 5,756,408 discloses a glass ceramic sintered body that contains 30 to 70% by weight of (Ca,Sr)—Al—Zn—Si—O type composite oxide and 30 to 70% by weight of Ca oxide and Zr oxide or $CaZrO_3$ as a filler. Unfortunately, the dielectric quality factor of the ceramic sintered body was not considered.

U.S. Pat. No. 4,988,651 discloses a dielectric ceramic composition represented by the general formula: xBaO-Y$SiO_2$-z{$ZrO_2$(1-$\beta$)$TiO_2$($\beta$1)$SnO_2$($\beta$2)} (wherein x, y and z are weight percentages of respective components; x+y+z=100; $\beta$=$\beta$1+$\beta$2, 0$\leq$$\beta$1, 0$\leq$$\beta$2, 0.01$\leq$$\beta$$\leq$0.03). However, due to the use of $TiO_2$, non-reducibility becomes poor.

Japanese Patent Application Laid-Open Publication No. 1-102806 discloses a dielectric ceramic composition represented by the general formula: [x(Ba$_{(1-a)}$Sr$_a$)O-y$SiO_2$-z$ZrO_2$]—$Al_2O_3$. The dielectric ceramic composition can be sintered at a low temperature under a non-reducing atmosphere. However, there are disadvantages in that a temperature characteristic of capacitance is ±100 (ppm/° C.)), a dielectric quality factor (Q) is 1,000, and an insulation resistance is very low in the level of $10^{12}$ $\Omega$cm.

Low temperature sinterable dielectric ceramic compositions can also be used in multilayer ceramic circuit boards for electronic devices. This is because dielectric compositions for multilayer ceramic circuit boards must be sintered in conjunction with internal electrodes made of base metals with low melting point. The use of high melting point metals as internal electrodes undesirably leads to a high electric resistance. Multilayer ceramic circuit boards are used as substrates on which semiconductor elements or various electronic elements are mounted, to thereby miniaturize electronic devices.

SUMMARY OF THE INVENTION

Therefore, the present invention has been made in view of the above problems, and it is an object of the present invention to provide a dielectric ceramic composition, which can be sintered in conjunction with an internal electrode at a low temperature under a reducing atmosphere, and which satisfies a temperature characteristic of capacitance of ±30 (ppm/° C.), a low dielectric constant and a high dielectric quality factor.

Another object of the present invention is to provide a multilayer ceramic chip capacitor made of the dielectric composition which can be sintered at a low temperature and has a low dielectric constant and a high dielectric quality factor at high frequency.

Yet another object of the present invention is to provide an electronic device using a multilayer ceramic circuit board made of the dielectric composition which can be sintered at a low temperature and has a low dielectric constant and a high dielectric quality factor at high frequency.

In accordance with one aspect of the present invention, the above and other objects can be accomplished by the provision of a dielectric ceramic composition which comprises a major composition represented by the general formula: x{$\alpha$BaO, (1-$\alpha$)SrO}-y{$SiO_2$}-z{(1-$\beta$)$ZrO_2$, $\beta$$Al_2O_3$} (wherein x, y and z are weight percentages; x+y+z=100, 55$\leq$x$\leq$75, 10$\leq$y$\leq$35, and 5$\leq$z$\leq$30, $\alpha$ and $\beta$ are moles; 0.4$\leq$$\alpha$$\leq$0.8 and 0.01$\leq$$\beta$$\leq$0.07) and 2 to 10 parts by weight of a Zn—B-silicate glass composition, per 100 parts by weight of the major composition.

Preferably, the Zn—B-silicate glass composition for the dielectric composition of the present invention comprises 15 to 25% by weight of $SiO_2$, 20 to 30% by weight of $B_2O_3$, and 40 to 50% by weight of ZnO. It further comprises 7% by weight or less of at least one selected from alkaline metals such as Li, K and Na, and 5% by weight or less of $Al_2O_3$.

In accordance with another aspect of the present invention, there is provided a multilayer ceramic chip capacitor comprising a plurality of dielectric ceramic layers, internal electrodes arrayed inside the dielectric ceramic layers, and outer electrodes electrically connected to the internal electrodes, characterized in that the dielectric ceramic layer is a sintered body of the dielectric ceramic composition which comprises a major composition represented by the general formula: $x\{\alpha BaO, (1-\alpha)SrO\}$-$y\{SiO_2\}$-$z\{(1-\beta)ZrO_2, \beta Al_2O_3\}$ (wherein x, y and z are weight percentages; x+y+z=100, $55 \leq x \leq 75$, $10 \leq y \leq 35$, and $5 \leq z \leq 30$, $\alpha$ and $\beta$ are moles; $0.4 \leq \alpha \leq 0.8$ and $0.01 \leq \beta \leq 0.07$) and 2 to 10 parts by weight of a Zn—B-silicate glass composition, per 100 parts by weight of the major composition, and the internal electrode is made of a conductive base metal material.

In accordance with yet another aspect of the present invention, there is provided a ceramic electronic device comprising a multilayer ceramic circuit board and at least one electronic elements which are mounted on the multilayer ceramic circuit board, characterized in that the multilayer ceramic circuit board comprises a plurality of dielectric ceramic layers, internal electrodes arrayed inside the dielectric ceramic layers, and outer electrodes electrically connected to the internal electrodes., the dielectric ceramic layer is a sintered body of the dielectric ceramic composition which comprises a major composition represented by the general formula: $x\{\alpha BaO, (1-\alpha)SrO\}$-$y\{SiO_2\}$-$z\{(1-\beta)ZrO_2, \beta Al_2O_3\}$ (wherein x, y and z are weight percentages; x+y+z=100, $55 \leq x \leq 75$, $10 \leq y \leq 35$, and $5 \leq z \leq 30$, $\alpha$ and $\beta$ are moles; $0.4 \leq \alpha \leq 0.8$, and $0.01 \leq \beta \leq 0.07$) and 2 to 10 parts by weight of a Zn—B-silicate glass composition, per 100 parts by weight of the major composition, and the internal electrode is made of a conductive base metal material.

BRIEF DESCRIPTION OF THE DRAWINGS

The above and other objects, features and other advantages of the present invention will be more clearly understood from the following detailed description taken in conjunction with the accompanying drawing, in which.

DESCRIPTION OF THE PREFERRED EMBODIMENTS

Hereinafter, the present invention will be described in more detail.

The dielectric composition of the present invention has a temperature characteristic of capacitance of ±30 (ppm/° C.)), a dielectric quality factor (Q) of 2,000 or more, an insulation resistance of $1 \times 10^{13}$ Ωcm or more, and a dielectric constant of 13 or less. Furthermore, it can be sintered in conjunction with an internal electrode made of a base metal at a low temperature of 1,000° C. or less due to its non-reducibility. Therefore, it is suitable for use in preparing a multilayer ceramic chip capacitor and a multilayer ceramic circuit board for an electronic device, requiring a low melting point base metal for an internal electrode.

Described below is the dielectric ceramic composition of the present invention.

Figure 1:
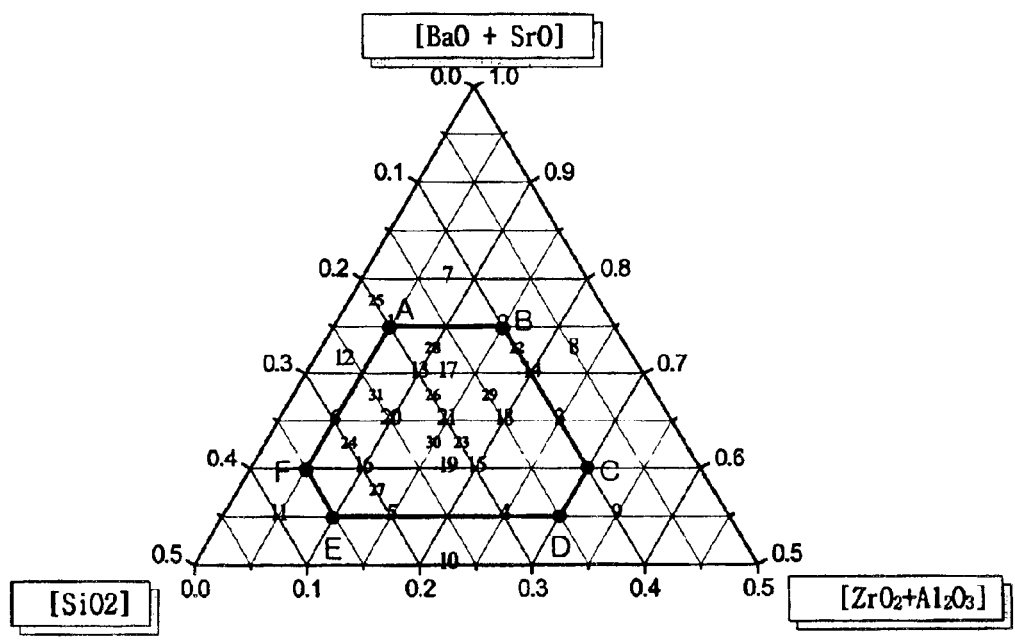
FIG. 1 is a triangular diagram showing compositional proportions of $\{BaO+SrO\}$, $\{SiO_2\}$ and $\{ZrO_2+Al_2O_3\}$.

FIG. 1 is a triangular diagram showing compositional proportions of $\{BaO+SrO\}$, $\{SiO_2\}$ and $\{ZrO_2+Al_2O_3\}$. The numbers on the drawing indicate multilayer ceramic chip capacitor samples listed in Table 2 as will be described hereinafter. The major composition of the present invention represented by the general formula: $x\{\alpha BaO, (1-\alpha)SrO\}$-$y\{SiO_2\}$-$z\{(1-\beta)ZrO_2, \beta Al_2O_3\}$ falls within the polygonal area defined by the points A(x=75 wt %, y=20 wt %, z=5 wt %), B(x=75 wt %, y=10 wt %, z=25 wt %), C(x=60 wt %, y=10 wt %, z=30 wt %), D(x=55 wt %, y=15 wt %, z=30 wt %), E(x=55 wt %, y=35 wt %, z=10 wt %) and F(x=60 wt %, y=35 wt %, z=5 wt %).

$\{\alpha BaO, (1-\alpha)SrO\}$: 55 to 75% by weight ($\alpha$ is mole; $0.4 \leq \alpha \leq 0.8$)

If the content of $\{\alpha BaO, (1-\alpha)SrO\}$ is less than 55% by weight, a dielectric quality factor (Q) is lowered and a temperature characteristic of capacitance is outside the range of ±30 (ppm/° C.). On the other hand, if it exceeds 75% by weight, all electric properties including a dielectric constant, a dielectric quality factor (Q), a temperature characteristic of capacitance and resistivity are poor. As the content of $\{\alpha BaO, (1-\alpha)SrO\}$ is larger, a temperature characteristic of capacitance increases in a negative direction, while as the content of $\{a BaO, (1-\alpha)SrO\}$ is smaller, a temperature characteristic of capacitance increases in a positive direction. It is most preferable to limit the content of $\{\alpha BaO, (1-\alpha)SrO\}$ to a range of 60 to 65% by weight.

It is preferable to limit the a value to a range of 0.4 to 0.8. As the $\alpha$ value is larger, a temperature characteristic of capacitance increases in a negative direction. On the other hand, as the a value is smaller, a temperature characteristic of capacitance increases in a positive direction. If the a value is outside the above range, a temperature characteristic of capacitance is outside the range of ±30 (ppm/° C.)).

$SiO_2$: 10 to 35% by Weight

If the content of $SiO_2$ exceeds 35% by weight, a dielectric quality factor is less than 1,000 and a temperature characteristic of capacitance is outside the range of ±30 (ppm/° C.)). If the content of $SiO_2$ is larger, a temperature characteristic of capacitance increases in a positive direction, while if it is smaller, a temperature characteristic of capacitance increases in a negative direction. If the content of $SiO_2$ is less than 10% by weight, a dielectric quality factor (Q), a temperature characteristic of capacitance, and resistivity are poor. It is most preferable to limit the content of $SiO_2$ to a range of 20 to 25% by weight.

$(1-\beta) ZrO_2, \beta Al_2O_3\}$: 5 to 30% by weight ($\beta$ is mole; $0.01 \leq \beta \leq 0.07$)

If the content of $\{(1-\beta)ZrO_2, \beta Al_2O_3\}$ is outside the above range, a dielectric quality factor (Q) is less than 1,500 and a temperature characteristic of capacitance is outside the range of ±30 (ppm/° C.). If the content of $\{(1-\beta) ZrO_2, \beta Al_2O_3\}$ is larger, a temperature characteristic of capacitance increases in a positive direction, while if it is smaller, a temperature characteristic of capacitance increases in a negative direction. It is most preferable to limit the content of $\{(1-\beta)ZrO_2, \beta Al_2O_3\}$ to a range of 10 to 20% by weight.

If the $\beta$ value is outside the above range, a temperature characteristic of capacitance is outside the range of ±30 (ppm/° C.)). If the $\beta$ value is larger, a temperature characteristic of capacitance increases in a positive direction and resistivity is less than $1.0 \times 10^{12}$ Ω cm due to formation of glass phase on the surfaces of sintered dielectric bodies. On the other hand, if the $\beta$ value is smaller, a temperature characteristic of capacitance increases in a negative direction and dense sintered dielectric bodies cannot be obtained, resulting in a dielectric quality factor (Q) of less than 1,000.

In accordance with the present invention, a Zn—B-silicate glass composition is added to the major composition that falls within the polygonal area defined by the points A, B, C, D, E and F in FIG. 1. If the major composition is the one having a set of x, y and z falling in the area outside the side ABC in FIG. 1, regardless of the added amount of the glass composition, glass phase on the surfaces of sintered dielectric bodies is present, resulting in less than $1.0 \times 10^{12}$ Ωcm of resistivity. Furthermore, a temperature characteristic of capacitance is outside the range of ±30 (ppm/° C.) and formation of electrodes is difficult.

Zn—B-Silicate Glass Composition: 2 to 10 Parts by Weight Based on 100 Parts by Weight of the Major Composition Preferably, the Zn—B-silicate glass composition of the present invention comprises $SiO_2$, $B_2O_3$ and ZnO. Such glass components react with $Al_2O_3$ of the major composition when sintered at a temperature of 800 to 1,000° C., resulting in crystallization of some glass composition. Such crystallization improves the mechanical stress of dielectric layers. Preferably, the Zn—B-silicate glass composition comprises 15 to 25% by weight of $SiO_2$, 20 to 30% by weight of $B_2O_3$ and 40 to 50% by weight of ZnO. The $SiO_2$ content of less than 15% by weight may cause crystallization of all the glass composition, making it difficult to lower a sintering temperature. On the other hand, the $SiO_2$ content of more than 25% by weight may raise the melting point of the glass composition, and thus low temperature sintering is difficult. If the content of $B_2O_3$ is less than 20% by weight or the content of ZnO is less than 40% by weight, the melting point of the glass composition is increased, whereby low temperature sintering is difficult. On the other hand, if the content of $B_2O_3$ exceeds 30% by weight or the content of ZnO exceeds 50% by weight, crystallization of all the glass composition is caused, making it difficult to lower a sintering temperature. Preferably, the glass composition further comprises 7% by weight or less of at least one selected from alkaline metals such as Li, K and Na, and 5% by weight or less of $Al_2O_3$. Alkaline metals act to lower a sintering temperature. In this regard, if the content of the alkaline metals exceeds 7% by weight, the dielectric composition forms dielectric layers of glass phase and thus sintered bodies cannot be obtained. $Al_2O_3$ acts to facilitate the formation of glass phase. In this regard, the content of $Al_2O_3$ of more than 5% by weight may retard the formation of glass phase. One embodiment of the Zn—B-silicate glass composition is presented in Table 1 below.

TABLE 1

| Glass composition (% by weight) | | | | | |
|---|---|---|---|---|---|
| $Al_2O_3$ | $SiO_2$ | ZnO | $B_2O_3$ | Alkaline metals | Others |
| <5 | 15–25 | 40–50 | 20–30 | Li < 5, K < 5 | Ce < 2, Sn < 2 |

Preferably, the content of the Zn—B-silicate glass composition of the present invention is 2 to 10 parts by weight based on 100 parts by weight of the major composition. If the content of the glass composition is outside this range, a temperature characteristic of capacitance is outside the range of ±30(ppm/° C.)). In detail, as the content of the glass composition is larger, a temperature characteristic of capacitance increases in a positive direction. Also, there is formation of glass phase on the surface of sintered dielectric bodies, resulting in less than $1.0 \times 10^{12}$ Ωcm of resistivity. On the other hand, as the content of the glass composition is smaller, a temperature characteristic of capacitance increases in a negative direction. Also, dense sintered bodies cannot be obtained and low temperature sintering cannot be accomplished. Most preferably, the content of the glass composition of the present invention is 4 to 8 parts by weight based on 100 parts by weight of the major composition.

The dielectric composition of the present invention satisfies a temperature characteristic of capacitance of ±30 (ppm/° C.), a dielectric quality factor (Q) of 2,000 or more, an insulation resistance of $1 \times 10^{13}$ Ωcm or more, and a dielectric constant of 13 or less. It can also be sintered in conjunction with an internal electrode made of a base metal at a low temperature of 1,000° C. or less under a neutral or reducing atmosphere and exhibits a high dielectric quality factor at high frequency (100 MHz or more). Therefore, it can be used in preparing a multilayer ceramic chip capacitor and a multilayer ceramic circuit board for an electronic device, requiring a small size, light weight and thin thickness.

Next, the multilayer ceramic chip capacitor of the present invention will be described.

The dielectric composition of the present invention can be sintered in conjunction with an internal electrode made of a low melting point base metal under a neutral or reducing atmosphere and it satisfies a temperature characteristic of capacitance of ±30 (ppm/° C.), a dielectric quality factor (Q) of 2,000 or more, an insulation resistance of $1 \times 10^{13}$ Ωcm or more, and a dielectric constant of 13 or less. Therefore, it can be used in preparing a multilayer ceramic chip capacitor requiring the electric properties mentioned above.

Figure 2:
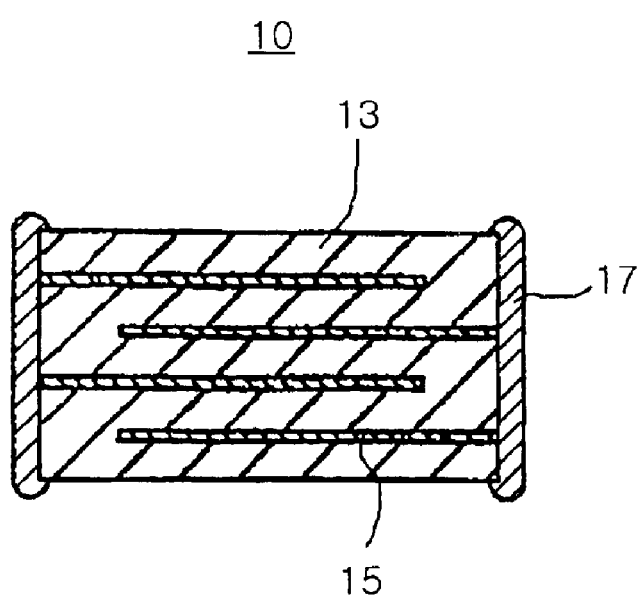
FIG. 2 is a view showing one embodiment of a multilayer ceramic chip capacitor.

FIG. 2 is a view showing one embodiment of a multilayer ceramic chip capacitor. The multilayer ceramic chip capacitor comprises a plurality of dielectric ceramic layers 13, internal electrodes 15 arrayed inside the dielectric ceramic layers 13, and outer electrodes 17 electrically connected to the internal electrodes 15.

In accordance with the present invention, the dielectric ceramic layer is a sintered body of the dielectric ceramic composition which comprises a major composition represented by the general formula: x{αBaO, (1−α)SrO}-y{$SiO_2$}-z{(1−β)$ZrO_2$, β$Al_2O_3$} (wherein x, y and z are weight percentages; x+y+z=100, 55≦x≦75, 10≦y≦35, and 5≦z≦30, α and β are moles; 0.4≦α≦0.8, and 0.01≦β≦0.07) and 2 to 10 parts by weight of a Zn—B-silicate glass composition, per 100 parts by weight of the major composition.

The internal electrode is made of a conductive base metal material such as Cu, Ag, Ni and alloys thereof. The external electrodes are composed of sintered layers of a conductive metal powder supplemented with a glass frit. A plating layer can be formed thereon. The plating layer is comprised of Ni, Cu or Ni—Cu alloys or a second plating layer containing tin or solder can be formed thereon.

One method for preparing the multilayer ceramic chip capacitor of the present invention is as follows. First, starting materials for the dielectric ceramic composition of the present invention are prepared in the form of powders by a solid phase method whereby oxides or carbonates are calcined at a high temperature, or a wet synthesis method such as a hydrothermal synthesis method and an alkoxide method. The prepared major composition powders and glass powders are mixed in a prescribed composition ratio. The mixed powders are turned into slurry by addition of an organic binder. In this case, it is preferable to limit the mean particle size of the major composition powder to a range of 0.3 to 1 μm. If the particle size is outside this range, an undesirable second phase is formed or unreacted raw material powders are left.

The slurry is molded into a sheet. Inner electrodes made of conductive base metals are then formed on one face of the sheet. Any methods including screen printing, vacuum deposition and plating may be used for forming the inner electrodes. Then, a required number of the sheets having the inner electrodes are laminated, to form a laminated body after pressing. The laminated body is sintered at a predetermined temperature under a reducing atmosphere. In accordance with the present invention, the sintering is accomplished at 1,000° C. or less. The sintering may be carried out under a neutral or reducing atmosphere of a low oxygen partial pressure state, i.e. a hydrogen partial pressure represented by the formula: $\{Log\ (PH_2/PH_2O)\}$ is −2 to −4. If the hydrogen partial pressure is more than −2, binder carbon remains un-oxidized and thus internal defects of sintered bodies may be caused. As a result, an insulation resistance may be lowered or internal cracks may be formed. If the hydrogen partial pressure is less than −4, internal electrodes may be oxidized within the range of the sintering temperature.

A pair of outer electrodes is formed on both side ends of the laminated body so as to be electrically connected to the inner electrodes, thereby completing the multilayer ceramic chip capacitor. Alternatively, the outer electrodes may be applied to the laminated body before sintering. Plating layers may be formed, if necessary, on the outer electrodes.

Finally, the electronic device of the present invention will be described.

The dielectric composition of the present invention can be sintered in conjunction with an internal electrode made of a low melting point base metal under a reducing atmosphere and it satisfies a temperature characteristic of capacitance of ±30 (ppm/° C.)), a dielectric quality factor (Q) of 2,000 or more, an insulation resistance of $1\times10^{13}$ Ω cm or more, and a dielectric constant of 13 or less. Therefore, it can be used in preparing a multilayer ceramic circuit board for an electronic device requiring the electric properties mentioned above.

Figure 3:
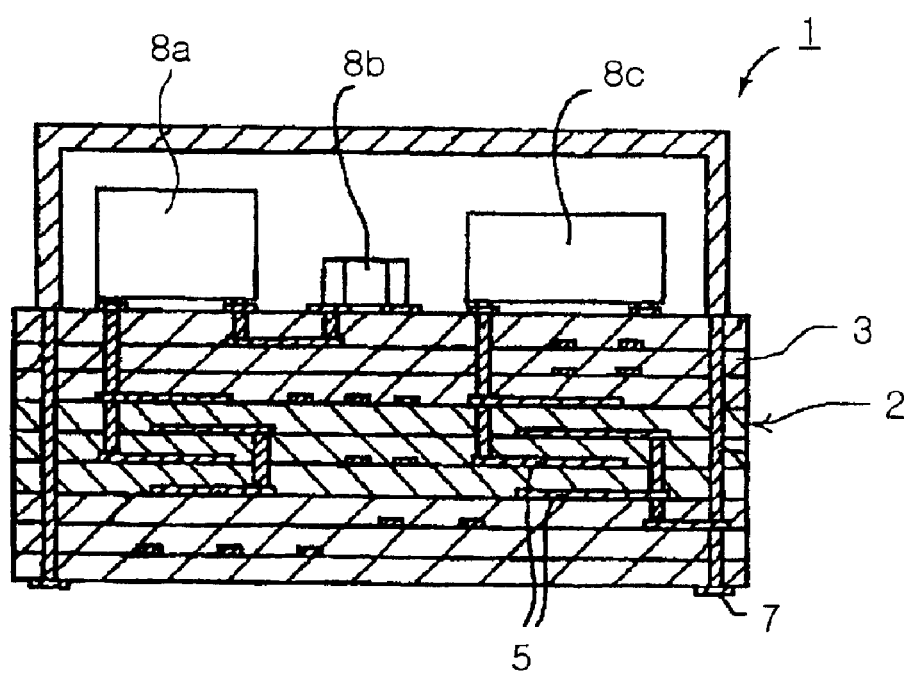
FIG. 3 is a view showing one embodiment of an electronic device.

FIG. 3 is a view showing one embodiment of an electronic device. The ceramic electronic device comprises a multilayer ceramic circuit board 2 and at least one electronic elements 8 which are mounted on the multilayer ceramic circuit board 2 and which constitute a circuit along with a plurality of internal electrodes 5. The multilayer ceramic circuit board comprises a plurality of dielectric ceramic layers, internal electrodes arrayed inside the dielectric ceramic layers, and outer electrodes 7 electrically connected to the internal electrodes.

In accordance with the present invention, the dielectric ceramic layer for the multilayer ceramic circuit board is a sintered body of the dielectric ceramic composition which comprises a major composition represented by the general formula: $x\{\alpha BaO,\ (1-\alpha)SrO\}$-$y\{SiO_2\}$-$z\{(1-\beta)ZrO_2,\ \beta Al_2O_3\}$ (wherein x, y and z are weight percentages; x+y+z=100, 55≤x≤75, 10≤y≤35, and 5≤z≤30, α and β are moles; 0.4≤α≤0.8, and 0.01≤β≤0.07) and 2 to 10 parts by weight of a Zn—B-silicate glass composition, per 0.100 parts by weight of the major composition.

The internal electrode is made of a conductive base metal material such as Cu, Ag, Ni and alloys thereof.

The internal electrodes 5 used for the multilayer ceramic circuit board of the present invention may be used to prepare a multilayer ceramic chip capacitor, along with at least one part of the dielectric ceramic layers 3.

The multilayer ceramic circuit board of the present invention may be used as substrate for multi-chip modules, hybrid ICs and the like. Various electronic elements are mounted on the multilayer ceramic circuit board to thereby form an electronic device. A representative electronic device is LTCC (Low Temperature Cofirable Ceramic).

Hereinafter, the present invention will be described in more detail by way of the following non-limiting examples.

EXAMPLES $BaCO_3$, $SrCO_3$, $ZrO_2$, $Al_2O_3$ and $SiO_2$ with purity of 99% or more as starting ceramic materials were weighed and completely mixed with a ball mill, to thereby obtain slurry. The slurry was dried without occurrence of layer separation to yield ceramic powder mixture of a mean particle size of 0.3 to 1.0 μm. Then, the ceramic powders were calcined for 1 hour to 4 hours at 750° C. to 950° C.

Each component of a Zn—B-silicate glass composition was wet milled into a glass composition powder mixture with a particle size of 0.3 to 1.0 μm with a zirconia ball using water or ethanol. The glass composition was composed of 20.57% by weight of $SiO_2$, 22.94% by weight of $B_2O_3$, 43.93% by weight of ZnO, 3.04% by weight of $Li_2O$, 3.30% by weight of $K_2O$, 3.95% by weight of $Al_2O_3$, and other impurities.

The ceramic powders and glass powders were mixed to thereby make slurry. The slurry was transformed into a sheet with a thickness of 15 to 70 μm by a die caster. Internal electrodes made of Cu were printed on the transformed sheet and then 3 to 10 layers of the pattern printed sheets were laminated one onto another. The resultant laminates were cut and sintered under a low oxygen partial pressure ($N_2$—$H_2$ gas atmosphere), i.e. $Log(PH_2/PH_2O)$: −2 to −4. The sintering was carried out for 1 hour to 4 hours at temperatures listed in Table 2 below to thereby form plate-shaped sintered bodies of 10 mm×10 mm×0.5 mm.

In—Ga alloys were applied on the both end faces of the sintered bodies to form external electrodes in order to obtain multilayer ceramic chip capacitor samples. The sample capacitors prepared as the above were evaluated for electric properties such as electric constant (K), dielectric quality factor (Q), temperature characteristic of capacitance (TCC), and resistivity (Ωcm).

Dielectric constant (K) and dielectric quality factor (Q) were measured at 1 MHz, 1 Vrms, 25° C. using HP4278A.

Temperature characteristic of capacitance was evaluated using the standard capacitance at 25° C.($C_{25}$), the capacitance at −55° C.($C_{-55}$), and the capacitance at 125° C.($C_{125}$), using the following equation:

$TCC(ppm/° C.)=\{(C_T-C_{25})/C_{25}(T-25° C.)\}\times10^6$ (wherein $C_T$ is capacitance at T).

Resistivity (ρ25) was evaluated in Ωcm unit using a measured leakage current after applying a DC voltage of 250V for 60 seconds at 25° C.

TABLE 2

| | Major composition | | | | | | Electric property | | | |
|---|---|---|---|---|---|---|---|---|---|---|
| | x{α BaO, (1-α) SrO} | y{SiO$_2$} | Z{(1-β) ZrO$_2$, β Al$_2$O$_3$} | | | Sintering temp. | Dielectric constant | Q | TCC | Resistivity |
| Sample | α    x | y | z | β | Glass | (° C.) | (K, 25° C.) | (25° C.) | (ppm/° C.) | (Ω cm) |
| 1 | 0.6  75 | 20 | 5 | 0.01 | 4 | 990 | 13 | 2250 | −20 | 2.9 × 10$^{14}$ |
| 2 | 0.6  75 | 10 | 15 | 0.01 | 4 | 1000 | 13 | 2120 | −30 | 4.2 × 10$^{14}$ |
| 3 | 0.6  65 | 20 | 15 | 0.02 | 4 | 970 | 12 | 2450 | −20 | 2.2 × 10$^{14}$ |
| 4 | 0.6  55 | 20 | 25 | 0.02 | 4 | 950 | 11 | 2530 | +20 | 1.1 × 10$^{14}$ |
| 5 | 0.6  55 | 30 | 15 | 0.02 | 4 | 930 | 11 | 2300 | +30 | 1.6 × 10$^{14}$ |
| 6 | 0.6  65 | 30 | 5 | 0.03 | 4 | 950 | 12 | 2420 | 0 | 2.6 × 10$^{14}$ |
| 7 | 0.6  80 | 12.5 | 7.5 | 0.03 | 4 | 1050 | 14 | 540 | −150 | 8.2 × 10$^{11}$ |
| 8 | 0.6  72.5 | 5 | 22.5 | 0.03 | 4 | 1100 | 13 | 840 | −120 | 1.1 × 10$^{11}$ |
| 9 | 0.6  55 | 10 | 35 | 0.03 | 4 | 970 | 11 | 520 | +90 | 4.0 × 10$^{11}$ |
| 10 | 0.6  50 | 27.5 | 22.5 | 0.03 | 4 | 910 | 11 | 1220 | +150 | 1.0 × 10$^{11}$ |
| 11 | 0.6  55 | 40 | 5 | 0.04 | 4 | 890 | 11 | 660 | +60 | 2.7 × 10$^{11}$ |
| 12 | 0.6  71.3 | 26 | 2.7 | 0.04 | 8 | 950 | 13 | 820 | −60 | 8.6 × 10$^{11}$ |
| 13 | 0.5  70 | 20 | 10 | 0.04 | 8 | 950 | 12 | 2620 | −20 | 1.7 × 10$^{14}$ |
| 14 | 0.5  70 | 10 | 20 | 0.04 | 8 | 970 | 12 | 2350 | 0 | 1.6 × 10$^{13}$ |
| 15 | 0.5  60 | 20 | 20 | 0.04 | 8 | 950 | 12 | 2940 | +20 | 4.9 × 10$^{13}$ |
| 16 | 0.5  60 | 30 | 10 | 0.05 | 8 | 930 | 11 | 3200 | +10 | 3.4 × 10$^{13}$ |
| 17 | 0.8  70 | 17.5 | 12.5 | 0.05 | 8 | 970 | 12 | 3420 | −10 | 1.7 × 10$^{13}$ |
| 18 | 0.8  65 | 15 | 20 | 0.05 | 8 | 950 | 12 | 3620 | 0 | 4.7 × 10$^{13}$ |
| 19 | 0.8  60 | 22.5 | 17.5 | 0.05 | 8 | 950 | 11 | 3240 | +10 | 2.7 × 10$^{13}$ |
| 20 | 0.8  65 | 25 | 10 | 0.05 | 8 | 950 | 12 | 2920 | +10 | 1.3 × 10$^{13}$ |
| 21 | 0.8  65 | 20 | 15 | 0.06 | 8 | 970 | 12 | 4120 | +10 | 4.5 × 10$^{13}$ |
| 22 | 0.3  70 | 10 | 20 | 0.06 | 8 | 970 | 11 | 2250 | +60 | 1.9 × 10$^{13}$ |
| 23 | 0.7  60 | 20 | 20 | 0.06 | 8 | 950 | 11 | 2640 | 0 | 2.4 × 10$^{13}$ |
| 24 | 0.9  60 | 30 | 10 | 0.06 | 8 | 950 | 13 | 2850 | −90 | 3.1 × 10$^{13}$ |
| 25 | 0.7  75 | 20 | 5 | 0 | 8 | 1030 | 14 | 640 | −60 | 1.8 × 10$^{12}$ |
| 26 | 0.7  65 | 20 | 15 | 0.04 | 8 | 950 | 12 | 2630 | −20 | 1.3 × 10$^{13}$ |
| 27 | 0.7  55 | 30 | 15 | 0.08 | 8 | 910 | 11 | 1260 | +90 | 1.7 × 10$^{11}$ |
| 28 | 0.7  70 | 17.5 | 12.5 | 0.07 | 1 | 1050 | 14 | 3520 | −150 | 2.4 × 10$^{14}$ |
| 29 | 0.7  65 | 15 | 20 | 0.07 | 4 | 970 | 12 | 2850 | −10 | 3.0 × 10$^{14}$ |
| 30 | 0.7  60 | 22.5 | 17.5 | 0.07 | 8 | 950 | 11 | 2420 | +20 | 1.2 × 10$^{13}$ |
| 31 | 0.7  65 | 25 | 10 | 0.07 | 11 | 930 | 12 | 320 | +90 | 1.3 × 10$^{11}$ | x, y and z are weight percentages.
The content of glass is based on 100 parts by weight of major composition As shown in Table 2, the capacitor of sample 7, in which the content of {BaO+SrO} exceeded 75% by weight, exhibited a high dielectric constant of 14 and a low dielectric quality factor (Q) of less than 1,000. The capacitor of sample 10, in which the content of {BaO+SrO} was less than 55% by weight, exhibited a dielectric quality factor (Q) of less than 1,500 and a temperature characteristic of capacitance outside the range of ±30 (ppm/° C.).

In case of the capacitor of sample 11, in which the content of SiO$_2$ exceeded 35% by weight, a dielectric quality factor (Q) was less than 1,000 and a temperature characteristic of capacitance was outside the range of ±30 (ppm/° C.).

In case of the capacitors of samples 9 and 12, in which the content of {ZrO$_2$+Al$_2$O$_3$} was outside the range, a dielectric quality factor (Q) was less than 1,500 and a temperature characteristic of capacitance was outside the range of ±30 (ppm/° C.).

In case of the capacitors of samples 22 and 24, in which the a value was outside the range, a temperature characteristic of capacitance was outside the range of ±30 (ppm/° C.).

In case of the capacitors of samples 25 and 27, in which the β value was outside the range, a temperature characteristic of capacitance was outside the range of ±30 (ppm/° C.)). The capacitor of sample 25 did not have dense sintered bodies and thus exhibited a dielectric quality factor (Q) of less than 1,000. The capacitor of sample 27 exhibited resistivity of less than 1.0×10$^{12}$ Ωcm due to formation of glass phase on the surfaces of sintered dielectric bodies.

In case of the capacitors of samples 28 and 31, in which the content of Zn—B-silicate glass composition was outside the range, a temperature characteristic of capacitance was outside the range of ±30 (ppm/° C.)). In case of the capacitor of sample 28, a dense sintered body was not obtained and a sintering temperature was as high as 1,050° C. The capacitor of sample 31 exhibited resistivity of less than 1.0×10$^{12}$ Ωcm due to formation of glass phase on the surface of sintered dielectric bodies.

As apparent from the above description, the dielectric composition of the present invention can be sintered in conjunction with an internal electrode made of a low melting point base metal at a low temperature of 1,000° C. or less. Furthermore, it satisfies a temperature characteristic of capacitance of ±30(ppm/° C.)), a dielectric quality factor (Q) of 2,000 or more, an insulation resistance at 25° C. of 1×10$^{13}$ Ωcm or more, and a dielectric constant of 13 or less. Therefore, it is suitable for use in preparing a multilayer ceramic chip capacitor and a multilayer ceramic circuit board for an electronic device requiring the electric properties mentioned above.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A low temperature sinterable dielectric ceramic composition which comprises a major composition represented by the general formula: x{α BaO, (1−α)SrO}-y{SiO$_2$}-z{

$(1-\beta)ZrO_2, \beta Al_2O_3\}$ (wherein x, y and z are weight percentages; x+y+z=100, $55 \leq x \leq 75$, $10 \leq y \leq 35$, and $5 \leq z \leq 30$, $\alpha$ and $\beta$ are moles; $0.4 \leq \alpha \leq 0.8$, and $0.01 \leq \beta \leq 0.07$) and 2 to 10 parts by weight of a Zn—B-silicate glass composition, per 100 parts by weight of the major composition.

2. The composition as set forth in claim 1, wherein x is 60 to 65% by weight, y is 20 to 25% by weight, and z is 10 to 20% by weight.

3. The composition as set forth in claim 1, wherein the Zn—B-silicate glass composition comprises 15 to 25% by weight of $SiO_2$, 20 to 30% by weight of $B_2O_3$, and 40 to 50% by weight of ZnO.

4. The composition as set forth in claim 3, wherein the Zn—B-silicate glass composition further comprises 7% by weight or less of at least one selected from alkaline metals such as Li, K and Na and 5% by weight or less of $Al_2O_3$.

5. The composition as set forth claim 1, wherein the content of Zn—B-silicate glass composition is 4 to 8 parts by weight based on 100 parts by weight of the major composition.

6. A multilayer ceramic chip capacitor comprising a plurality of dielectric ceramic layers, internal electrodes arrayed inside the dielectric ceramic layers, and outer electrodes electrically connected to the internal electrodes, characterized in that the dielectric ceramic layer is a sintered body of the dielectric ceramic composition which comprises a major composition represented by the general formula: $x\{\alpha BaO, (1-\alpha)SrO\}$-$y\{SiO_2\}$-$z\{(1-\beta)ZrO_2, \beta Al_2O_3\}$ (wherein x, y and z are weight percentages; x+y+z=100, $55 \leq x \leq 75$, $10 \leq y \leq 35$, and $5 \leq z \leq 30$, $\alpha$ and $\beta$ are moles; $0.4 \leq \alpha \leq 0.8$, and $0.01 \leq \beta \leq 0.07$) and 2 to 10 parts by weight of a Zn—B-silicate glass composition, per 100 parts by weight of the major composition, and the internal electrode is made of a conductive base metal material.

7. The capacitor as set forth in claim 6, wherein x is 60 to 65% by weight, y is 20 to 25% by weight, and z is 10 to 20% by weight.

8. The capacitor as set forth in claim 6, wherein the Zn—B-silicate glass composition comprises 15 to 25% by weight of $SiO_2$, 20 to 30% by weight of $B_2O_3$, and 40 to 50% by weight of ZnO.

9. The capacitor as set forth in claim 6, wherein the Zn—B-silicate glass composition further comprises 7% by weight or less of at least one selected from alkaline metals such as Li, K and Na and 5% by weight or less of $Al_2O_3$.

10. The capacitor as set forth in claim 6, wherein the content of Zn—B-silicate glass composition is 4 to 8 parts by weight based on 100 parts by weight of the major composition.

11. The capacitor as set forth in claim 6, wherein the dielectric ceramic layer comprises a crystallized phase of some glass composition after sintered at 800 to 1,000° C.

12. A ceramic electronic device comprising a multilayer ceramic circuit board and at least one electronic elements which are mounted on the multilayer ceramic circuit board, characterized in that the multilayer ceramic circuit board comprises a plurality of dielectric ceramic layers, internal electrodes arrayed inside the dielectric ceramic layers, and outer electrodes electrically connected to the internal electrodes, the dielectric ceramic layer is a sintered body of the dielectric ceramic composition which comprises a major composition represented by the general formula: $x\{\alpha BaO, (1-\alpha)SrO\}$-$y\{SiO_2\}$-$z\{(1-\beta)ZrO_2, \beta Al_2O_3\}$ (wherein x, y and z are weight percentages; x+y+z=100, $55 \leq x \leq 75$, $10 \leq y \leq 35$, and $5 \leq z \leq 30$, $\alpha$ and $\beta$ are moles; $0.4 \leq \alpha \leq 0.8$, and $0.01 \leq \beta \leq 0.07$) and 2 to 10 parts by weight of a Zn—B-silicate glass composition, per 100 parts by weight of the major composition, and the internal electrode is made of a conductive base metal material.

13. The electronic device as set forth in claim 12, wherein x is 60 to 65% by weight, y is 20 to 25% by weight, and z is 10 to 20% by weight.

14. The electronic device as set forth in claim 12, wherein the Zn—B-silicate glass composition comprises 15 to 25% by weight of $SiO_2$, 20 to 30% by weight of $B_2O_3$, and 40 to 50% by weight of ZnO.

15. The electronic device as set forth in claim 12, wherein the Zn—B-silicate glass composition further comprises 7% by weight or less of at least one selected from alkaline metals such as Li, K and Na and 5% by weight or less of $Al_2O_3$.

16. The electronic device as set forth in claim 12, wherein the content of Zn—B-silicate glass composition is 4 to 8 parts by weight based on 100 parts by weight of the major composition.

17. The electronic device as set forth in claim 12, wherein the dielectric ceramic layer comprises a crystallized phase of some glass composition after sintered at 800 to 1,000° C.

* * * * *